(12) United States Patent
Takase

(10) Patent No.: US 10,437,668 B2
(45) Date of Patent: Oct. 8, 2019

(54) MEMORY CONTROLLER, MEMORY SYSTEM, AND METHOD FOR CONTROLLING MEMORY SYSTEM

(71) Applicant: Toshiba Memory Corporation, Minato-ku (JP)

(72) Inventor: Yasuhiro Takase, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 91 days.

(21) Appl. No.: 15/698,836

(22) Filed: Sep. 8, 2017

(65) Prior Publication Data

US 2018/0253353 A1 Sep. 6, 2018

(30) Foreign Application Priority Data

Mar. 6, 2017 (JP) ................................. 2017-041765

(51) Int. Cl.
*H03M 13/00* (2006.01)
*G06F 11/10* (2006.01)
(Continued)

(52) U.S. Cl.
CPC ...... *G06F 11/1068* (2013.01); *G06F 11/1012* (2013.01); *G11C 29/52* (2013.01);
(Continued)

(58) Field of Classification Search
CPC ............. G06F 11/1068; G06F 11/1012; G06F 11/1048; G06F 11/1008; G11C 29/52;
(Continued)

(56) References Cited

U.S. PATENT DOCUMENTS 8,429,498 B1 * 4/2013 Anholt ................ G06F 11/1048
365/227
8,464,134 B2 6/2013 Alrod et al.
(Continued)

FOREIGN PATENT DOCUMENTS

JP 2012-244305 12/2012
JP 2014-523595 9/2014
(Continued)

*Primary Examiner* — Guerrier Merant
(74) *Attorney, Agent, or Firm* — Oblon, McClelland, Maier & Neustadt, L.L.P.

(57) ABSTRACT

According to one embodiment, a memory controller includes: a memory I/F that reads a codeword written in a NAND memory as any one of hard-bit information, first soft-bit information, and second soft-bit information; a codeword processor that generates a codeword of an first soft-decision value from the first soft-bit information, and generates a codeword of a second soft-decision value from the second soft-bit information; a first decoder that executes hard-decision decoding on a codeword of a hard-decision value configured from the hard-bit information; a second decoder that executes first soft-decision decoding on the codeword of the first soft-decision value; and a third decoder that executes second soft-decision decoding on the codeword of the second soft-decision value, wherein the first soft-bit information includes information having a first number of bits greater than the number of bits of the hard-bit information, and the second soft-bit information includes information having a second number of bits greater than the number of bits of the first soft-bit information.

19 Claims, 4 Drawing Sheets

(51) Int. Cl.
*H03M 13/45* (2006.01)
*H03M 13/29* (2006.01)
*G11C 29/52* (2006.01)
*H03M 13/11* (2006.01)
*H03M 13/37* (2006.01)
*G11C 11/56* (2006.01)
*G11C 16/04* (2006.01)
*G11C 16/26* (2006.01)
*G11C 29/04* (2006.01)
*H03M 13/41* (2006.01)

(52) U.S. Cl.
CPC .... *H03M 13/1108* (2013.01); *H03M 13/1111* (2013.01); *H03M 13/2906* (2013.01); *H03M 13/3715* (2013.01); *H03M 13/3738* (2013.01); *H03M 13/45* (2013.01); *G11C 11/5642* (2013.01); *G11C 16/0483* (2013.01); *G11C 16/26* (2013.01); *G11C 2029/0411* (2013.01); *H03M 13/4138* (2013.01); *H03M 13/6325* (2013.01)

(58) Field of Classification Search
CPC ............ G11C 16/26; G11C 2029/0411; G11C 11/5642; G11C 16/0483; G11C 29/844; H03M 13/45; H03M 13/2906; H03M 13/6325; H03M 13/1111; H03M 13/3927; H03M 13/3707; H03M 13/451; H03M 13/458; H03M 13/1108
See application file for complete search history.

(56) References Cited

U.S. PATENT DOCUMENTS

| | | | |
|---|---|---|---|
| 8,775,913 B2* | 7/2014 | Haratsch | G11C 7/04 714/773 |
| 8,782,496 B2 | 7/2014 | Sakaue et al. | |
| 8,856,611 B2* | 10/2014 | Wu | G11C 29/52 714/752 |
| 8,874,994 B2 | 10/2014 | Sharon et al. | |
| 9,176,814 B2 | 11/2015 | Cherubini et al. | |
| 9,286,155 B1* | 3/2016 | Low | G06F 11/1008 |
| 2014/0040704 A1* | 2/2014 | Wu | G06F 11/1068 714/773 |
| 2014/0122975 A1* | 5/2014 | Patapoutian | G06F 11/1048 714/773 |
| 2015/0178154 A1* | 6/2015 | Kim | G06F 11/1048 714/758 |
| 2016/0055055 A1* | 2/2016 | Harada | G11C 29/52 714/764 |
| 2016/0182087 A1* | 6/2016 | Sommer | H03M 13/1148 714/752 |
| 2016/0274971 A1* | 9/2016 | Kang | G06F 11/1068 |
| 2016/0328287 A1* | 11/2016 | Kim | G11C 11/5642 |

FOREIGN PATENT DOCUMENTS

JP 5846589 1/2016
JP 5887589 3/2016

* cited by examiner

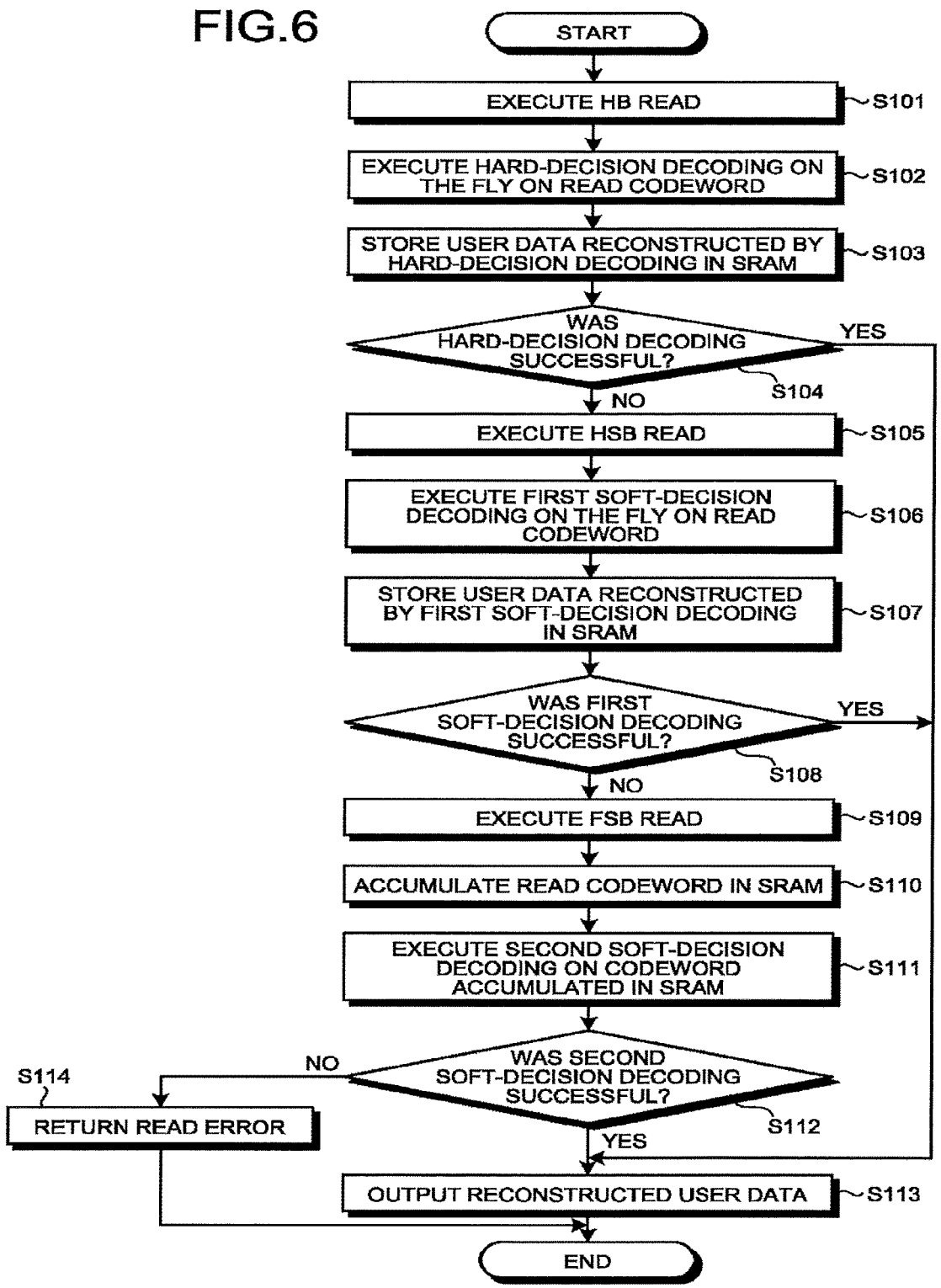

MEMORY CONTROLLER, MEMORY SYSTEM, AND METHOD FOR CONTROLLING MEMORY SYSTEM

CROSS-REFERENCE TO RELATED APPLICATIONS

This application is based upon and claims the benefit of priority from Japanese Patent Application No. 2017-041765, filed on Mar. 6, 2017; the entire contents of all of which are incorporated herein by reference.

FIELD

An embodiment of the present invention described herein relates generally to a memory controller, a memory system, and a method for controlling a memory system.

BACKGROUND

In a storage device, an error correction coded data is generally stored to protect data to be stored. Hence, when the data stored in the storage device is read, the error correction coded data is decoded.

BRIEF DESCRIPTION OF THE DRAWINGS

FIG. 6 is a flowchart illustrating an example of a read operation according to the embodiment.

DETAILED DESCRIPTION

In general, according to one embodiment, a memory controller that is connected to one or more nonvolatile memories, the memory controller includes: a memory interface that reads a codeword written in any one of the one or more nonvolatile memories as any one of hard-bit information, first soft-bit information, and second soft-bit information; a codeword processor that generates a codeword of a first soft-decision value from the first soft-bit information, and generates a codeword of a second soft-decision value from the second soft-bit information; a first decoder that executes hard-decision decoding on a codeword of a hard-decision value configured from the hard-bit information; a second decoder that executes first soft-decision decoding on the codeword of the first soft-decision value; and a third decoder that executes second soft-decision decoding on the codeword of the second soft-decision value, wherein the first soft-bit information includes information having a first number of bits greater than the number of bits of the hard-bit information, and the second soft-bit information includes information having a second number of bits greater than the first number of bits.

An exemplary embodiment of a memory controller, a memory system, and a method for controlling a memory system will be explained below in detail with reference to the accompanying drawings. The present invention is not limited to the following embodiment.

Figure 1:
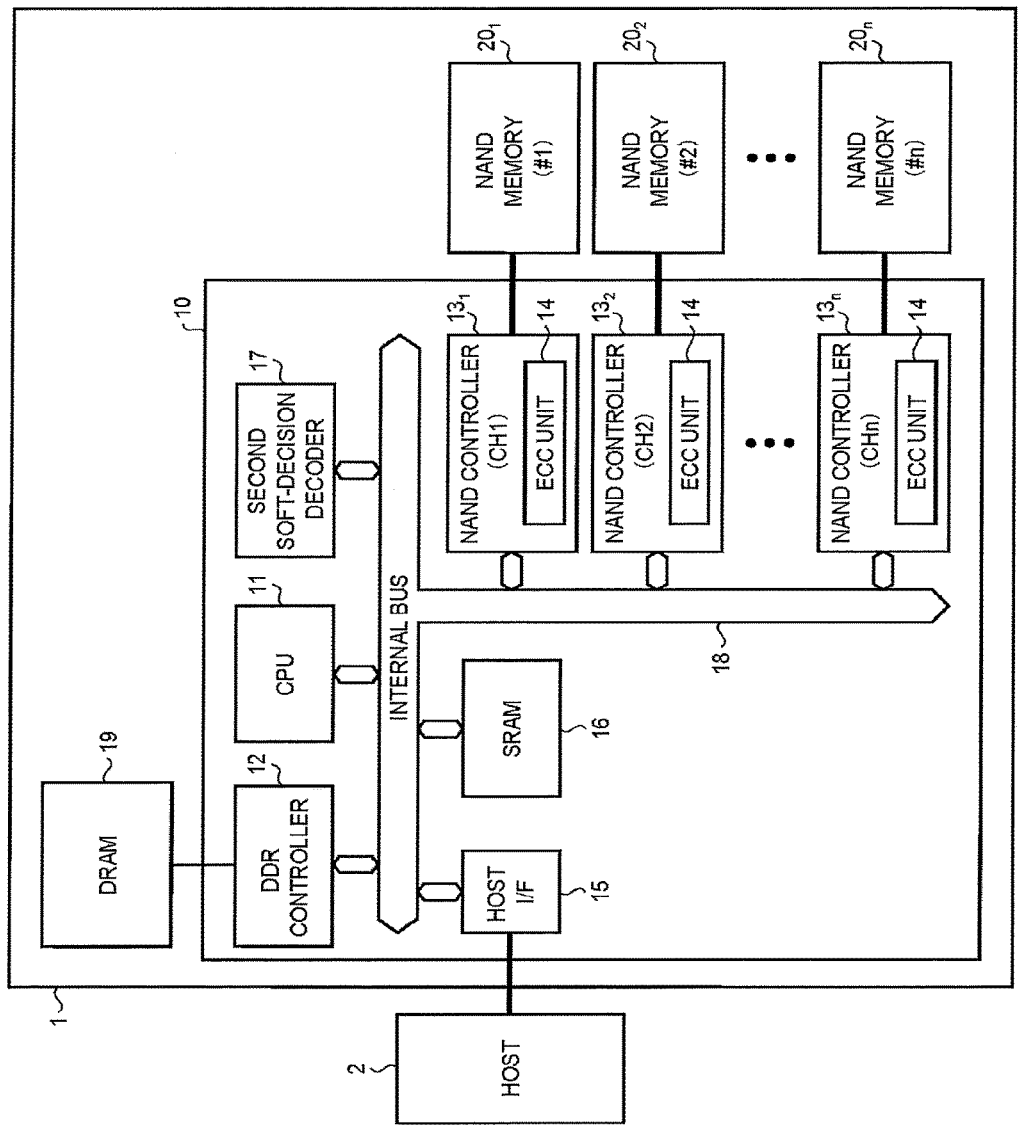
FIG. 1 is a block diagram illustrating an example of schematic configuration of a memory system according to an embodiment.

FIG. 1 is a block diagram illustrating an example of schematic configuration of a memory system (semiconductor storage device) according to the embodiment. FIG. 1 illustrates, by example, a flash SSD (Solid State Drive) using NAND flash memory (hereinafter also referred to as NAND memory) as a memory system 1 according to the embodiment. However, the embodiment is not limited to this configuration. The following embodiment can also be applied to various memory systems such as a memory card including a memory controller and nonvolatile memory as one package.

As illustrated in FIG. 1, the memory system 1 can be connected to a host 2 via a predetermined communication interface such as SAS (Serial Attached SCSI), SATA (Serial ATA), or PCIe™ (PCI Express). The host 2 may be an information processing device such as a personal computer or mobile terminal. In such a case, the memory system 1 can operate as an external storage device of the host 2.

The memory system 1 includes a memory controller 10, a DRAM (Dynamic Random Access Memory) 19, and n (n is an integer of one or greater) NAND memories $20_1$ to $20_n$. n may be a number such as 18. In this case, in the example illustrated in FIG. 1, the memory system 1 includes a total of 18 NAND memories $20_1$ to $20_{18}$ of #1 to #18. When the NAND memories $20_1$ to $20_n$ are not individually distinguished in the following description, a reference numeral of the NAND memories $20_1$ to $20_n$ is assumed to be 20. Moreover, various kinds of memory such as synchronous DRAM such as SDRAM (Synchronous Dynamic Random Access Memory) and asynchronous DRAM can be used for the DRAM 19.

Each NAND memory 20 is nonvolatile memory to store data in a nonvolatile manner. However, the embodiment is not limited to the NAND memory. Various storage devices such as three-dimensional flash memory, ReRAM (Resistance Random Access Memory), and FeRAM (Ferroelectric Random Access Memory) can be used. Moreover, the embodiment is not limited to semiconductor memory such as the NAND memory 20. Various storage media other than a semiconductor memory can also be used.

In the NAND memory 20, generally, writing and reading is performed in data unit called page, and erasing is performed in data unit called block. In the embodiment, a plurality of memory cells connected to the same word line is called a memory cell group. If the memory cell is SLC (Single Level Cell) to store binary data, one memory cell group corresponds to one page. If the memory cell is MLC (Multiple Level Cell), TLC (Triple Level Cell), or the like, to store data of multi-value equal to or more than four values, one memory cell group corresponds to a plurality of pages. Moreover, each memory cell is connected to one word line, and also to one bit line. Therefore, each memory cell can be identified with an address identifying a word line and an address identifying a bit line.

The memory controller 10 may be a semiconductor device constructed by a design technique such as a SoC (System on Chip). An access request (such as a read request or a write request) is inputted into the memory controller 10 from the host 2. The access request from the host 2 can include a logical address that specifies the location of data in a logical address space. The memory controller 10 controls the writing of data into the NAND memory 20 in accordance with a write request from the host 2. Moreover, the memory controller 10 controls the reading of data from the NAND memory 20 in accordance with a read request from the host 2.

The memory controller 10 includes channels that are equal or less in number to the number of the NAND memories 20. Channels that are equal in number to the number of the NAND memories 20, that is, n channels, are provided in, for example, the example illustrated in FIG. 1. One or more NAND memories 20 are connected to each channel. Each channel is configured including a control signal line, an I/O signal line, a CE (chip enable) signal line, and a RY/BY signal line. The I/O signal line is a signal line for transmitting and receiving data, an address, and a command. The control signal line is a general term of a WE (write enable) signal line, a RE (read enable) signal line, a CLE (command latch enable) signal line, an ALE (address latch enable) signal line, a WP (write protect) signal line, and the like. The memory controller 10 can control one or more NAND memories 20 connected to one channel independently of the NAND memories 20 connected to other channels, using the independence of signal line groups of the channels from each other.

The memory controller 10 includes a CPU (control circuit) 11, a DDR controller 12, NAND controllers $13_1$ to $13_n$ that are equal in number to the number of the channels, a host I/F (host interface) 15, a SRAM (Static Random Access Memory) 16, and a second soft-decision decoder 17. The CPU 11, the DDR controller 12, the NAND controllers $13_1$ to $13_n$, the host I/F 15, the SRAM 16, and the second soft-decision decoder 17 are connected to each other via an internal bus 18. Each of the n NAND controllers $13_1$ to $13_n$ configures a part of a different channel. When the NAND controllers $13_1$ to $13_n$ are not individually distinguished in the following description, a reference numeral of the NAND controllers $13_1$ to $13_n$ is assumed to be 13.

The host I/F 15 performs processes in accordance with an interface standard in between with the host 2, and outputs a command, user data, and the like, which have been received from the host 2, to the internal bus 18. Moreover, the host I/F 15 transmits, to the host 2, user data reconstructed by decoding a codeword (also referred to as a received word) read from the NAND memory 20, a response from the CPU 11, and the like.

The user data received by the memory controller 10 from the host 2 is temporarily stored in the SRAM 16. Moreover, the received word read from the NAND memory 20 and the user data reconstructed by decoding the received word are temporarily stored in the SRAM 16. In this manner, the SRAM 16 acts as a data buffer to temporarily store user data, a received word, and the like upon writing/reading. The DRAM 19, instead of the SRAM 16, may be used as the temporary storage location for user data, a received word, and the like. In this case, the DDR controller 12 controls the loading and unloading of data and the like into and from the DRAM 19.

The DRAM 19 is memory that can be used as working memory to store various management tables such as an address translation table and a master table (snapshot) read from a specific area of the NAND memory 20 and developed at startup, log information being a difference of a change in various management tables, and the like. Moreover, the DRAM 19 can also be used as cache memory to transfer data between the host 2 and the NAND memory 20.

The CPU 11 integrally controls constituent elements of the memory system 1. When accepting a command from the host 2 via the host I/F 15, the CPU 11 executes control in accordance with the command. For example, when receiving a write request from the host 2, the CPU 11 translates a logical address specified by the write request into a physical address using an unillustrated address translation table, and instructs the NAND controller 13 corresponding to the physical address to encode user data and write a codeword obtained by the encoding into the NAND memory 20. Moreover, when receiving a read request from the host 2, the CPU 11 translates a logical address specified by the read request into a physical address using the unillustrated address translation table, and instructs the NAND controller 13 corresponding to the physical address to read a codeword from the NAND memory 20 and decode the read codeword (received word).

The correspondence relationship between the logical address and the physical address is managed by the CPU 11, and is registered in the address translation table. In other words, the CPU 11 manages a write destination of user data (actually, a codeword) using the address translation table. For example, when receiving a write request from the host 2, the CPU 11 temporarily accumulates write-target user data corresponding to the write request in the SRAM 16, and also determines a storage area (a storage location of the data in a physical address space) in the NAND memory 20 for the user data accumulated in the SRAM 16, and registers, in the address translation table, the correspondence between the determined storage area and the logical address included in the write request. The address translation table is held by, for example, the SRAM 16 or the DRAM 19.

Each NAND controller 13 includes an ECC unit 14 that encodes/decodes write/read target data. The ECC unit 14 encodes write-target user data temporarily accumulated in the SRAM 16, and generates a codeword. Moreover, the ECC unit 14 decodes a received word read from the NAND memory 20 on the fly where needed to reconstruct the user data. Target data encoded/decoded by the ECC unit 14 can include control data used in the memory controller 10, in addition to the user data. Moreover, "on the fly" in the description indicates directly decoding a received word read by, for example, a memory I/F 132 (refer to FIG. 2) without temporarily accumulating the received word in a storage area provided outside the NAND controller 13, such as the SRAM 16 or the DRAM 19.

Figure 2:
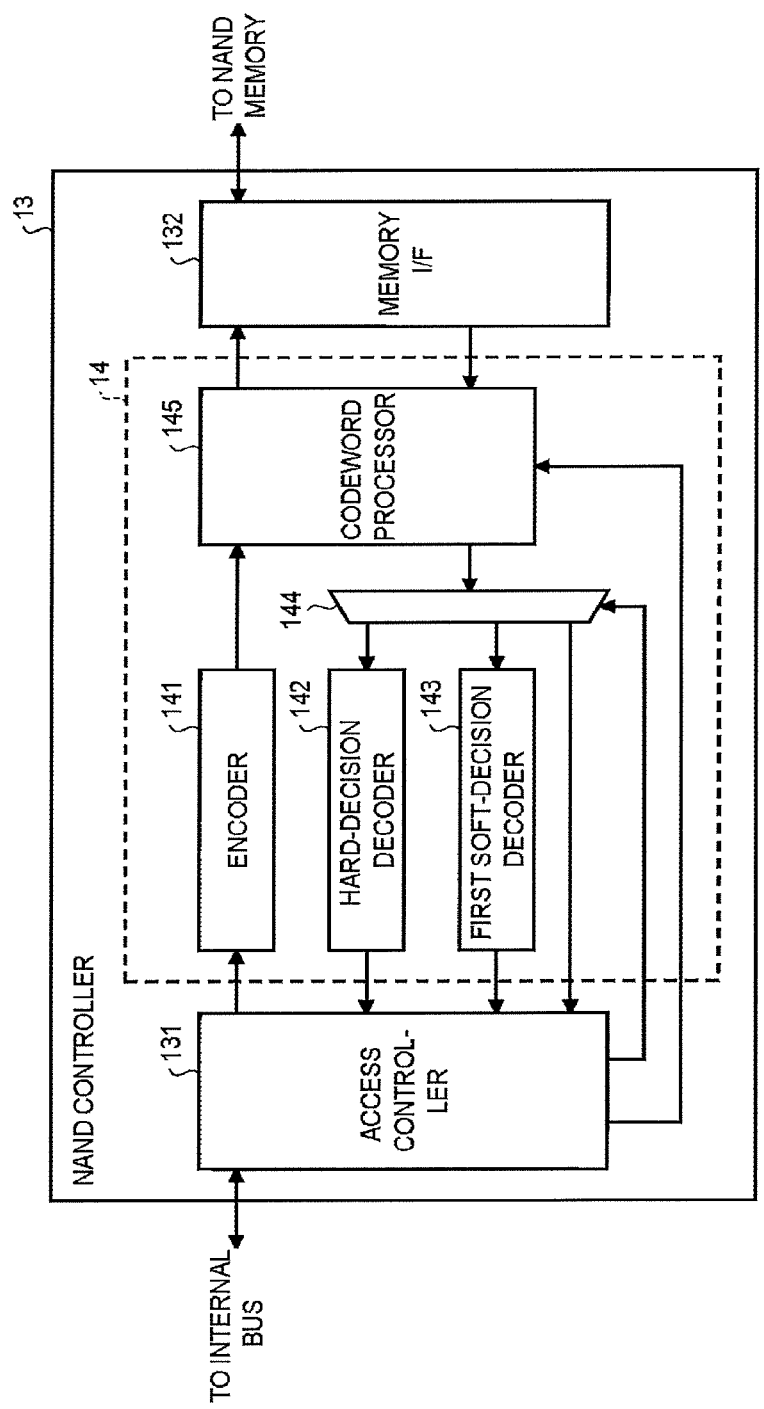
FIG. 2 is a block diagram illustrating a more detailed example of configuration of each NAND controller according to the embodiment.

FIG. 2 illustrates a more detailed example of configuration of each NAND controller 13. As illustrated in FIG. 2, the NAND controller 13 includes an access controller 131 and the memory interface (memory I/F) 132 in addition to the ECC unit 14.

The access controller 131 controls access to the NAND memory 20 from outside the NAND controller 13. Moreover, the access controller 131 outputs a select signal to cause a selector 144 included in the ECC unit 14 to select a transmission path of a received word read from the NAND memory 20.

The memory I/F 132 executes writing/reading on the NAND memory 20. In the embodiment, a hard-decision read (also referred to as the HB (Hard-Bit) read) to read binary data (hereinafter referred to as hard-bit information) from each memory cell of the NAND memory 20, a first soft-decision read (also referred to as the HSB (Half-Soft-Bit) read) to read binary data (hereinafter referred to as soft-bit information) equal to a first number of pages (two or more pages) from each memory cell of the NAND memory 20, and a second soft-decision read (also referred to as the FSB (Full-Soft-Bit) read) to read binary data (soft-bit information) equal to a second number of pages greater than the first number of pages, from each memory cell of the NAND memory 20 are illustrated by example as read operations executed by the memory I/F 132. The memory I/F 132 executes any one of the read operations, the HB read, the HSB read, and the FSB read, in accordance with an instruction of, for example, the CPU 11 or the access controller 131, and inputs, into the ECC unit 14, hard-bit information or soft-bit information read as a result of the read operation.

The hard-bit information here may be, for example, one page's worth of information, and be the same values as what are called hard-decision values. The page indicates, for example, a LOWER page, a MIDDLE page, and an UPPER page in TLC. Moreover, the soft-bit information is information to generate soft-decision values (corresponding to the log-likelihood ratios (Log Likelihood Ratio: LLR)) described below. Generating soft-decision values (LLRs) using soft-bit information is described below with reference to the drawings.

The ECC unit 14 includes an encoder 141, a hard-decision decoder 142, a first soft-decision decoder 143, the selector 144, and a codeword processor 145. The encoder 141 is an encoder that employs a coding method using a Low-Density Parity-Check (LDPC) code. The use of the encoder 141 that employs the LDPC coding method enables an increase in error-correction capability without increasing the code length of a codeword generated. As a result, it becomes possible to construct a highly reliable memory system that has reduced the BER (Bit Error Rate) without reducing the OP (Over-Provisioning) ratio.

The encoder 141 encodes user data on the SRAM 16 and generates a codeword on the basis of, for example, an instruction of the CPU 11. The generated codeword is written by the memory I/F 132 at a specified physical address in the NAND memory 20. The specification of a physical address is inputted into the memory I/F 132 by, for example, the access controller 131 that has received a write instruction from the CPU 11.

The codeword processor 145 is, for example, a SOVA (Soft Output Viterbi Algorithm) decoder that executes decoding using the Viterbi algorithm. The codeword processor 145 generates a soft-decision value (LLR) of each symbol configuring a read-target codeword, from soft-bit information read by the memory I/F 132 from the NAND memory 20, and outputs, to the selector 144, a received word of the soft-decision values (LLRs) generated as a result. An LLR table described below or the like can be used to generate soft-decision values (LLRs). The codeword processor 145 outputs hard-bit information that does not need to generate soft-decision values (LLR), as it is, as a received word of hard-decision values to the selector 144.

The selector 144 selects a transmission path (output destination) of a received word of hard-decision values or soft-decision values (LLRs) outputted from the codeword processor 145, from the hard-decision decoder 142, the first soft-decision decoder 143, and the access controller 131, in accordance with, for example, a select signal from the access controller 131.

The hard-decision decoder 142 is a first decoder that executes hard-decision decoding on a received word of hard-decision values. When receiving, via the selector 144, an input of a received word of hard-decision values acquired in the hard-decision read (HB read) from the NAND memory 20, the hard-decision decoder 142 executes hard-decision decoding on the fly on the inputted received word.

The first soft-decision decoder 143 is a second decoder that executes soft-decision decoding (called first soft-decision decoding) on a received word of soft-decision values (LLRs) generated from, for example, soft-bit information equal to the first number of pages (hereinafter also referred to as a received word of HSB soft-decision values). When receiving, via the selector 144, an input of a received word of HSB soft-decision values acquired in the first soft-decision read (HSB read) from the NAND memory 20, the first soft-decision decoder 143 executes first soft-decision decoding on the fly on the inputted received word.

On the other hand, a received word inputted by the selector 144 directly into the access controller 131 not via the hard-decision decoder 142 and the first soft-decision decoder 143 is accumulated in, for example, the SRAM 16 illustrated in FIG. 1. The received word accumulated in the SRAM 16 is decoded by the second soft-decision decoder 17 (refer to FIG. 1). The second soft-decision decoder 17 is a third decoder that executes soft-decision decoding (called second soft-decision decoding) on, for example, a received word of soft-decision values (LLRs) generated from soft-bit information equal to the second number of pages (hereinafter also referred to as a received word of FSB soft-decision values). When a received word of FSB soft-decision values acquired in the second soft-decision read (FSB read) from the NAND memory 20 is accumulated in the SRAM 16, the second soft-decision decoder 17 executes second soft-decision decoding on the received word accumulated in the SRAM 16 in accordance with, for example, an instruction of the CPU 11.

Hard-decision decoding is a decoding process to execute decoding with a hard-decision value as an input, and output the hard-decision value as a result of decoding. On the other hand, soft-decision decoding (first soft-decision decoding and second soft-decision decoding) is a decoding process to execute decoding with a soft-decision value (LLR) as an input and output the soft-decision value (LLR) as a result of decoding. Soft-decision decoding (first soft-decision decoding and second soft-decision decoding) usually has a feature of having a higher error-correction capability than hard-decision decoding but having a long processing time. Moreover, in the embodiment, second soft-decision decoding has a feature of having a still higher error-correction capability than first soft-decision decoding but having a longer processing time. Hence, the embodiment has the following configuration: A codeword is read first as hard-decision values from the NAND memory 20 to perform hard-decision decoding on the codeword. The codeword that could not be decoded by hard-decision decoding is read as HSB soft-decision values. The codeword that has been read as the HSB soft-decision values undergoes first soft-decision decoding, and if decoding failed in first soft-decision decoding, then the codeword is read as FSB soft-decision values. The codeword that has been read as the FSB soft-decision values undergoes second soft-decision decoding.

In this manner, it is configured in such a manner as to increase the amount of information of a codeword (received word) in stages according to the success/failure of decoding and sequentially execute decoding where the error-correction capability is increased in stages. Accordingly, even if, for example, read disturb (RD) or data retention (DR) causes a reduction in BER, the error-correction capability can be increased in stages according to the situation and the like. As a result, a bit error can be efficiently and effectively corrected. However, the embodiment is not limited to such a configuration, and various modifications such as a configuration to execute first or second soft-decision decoding first without hard-decision decoding can be made.

For example, bounded distance decoding can be applied as a decoding method of hard-decision decoding, first soft-decision decoding, and second soft-decision decoding. However, the decoding method is not limited to bounded distance decoding, and various decoding methods may be applied.

Figure 3:
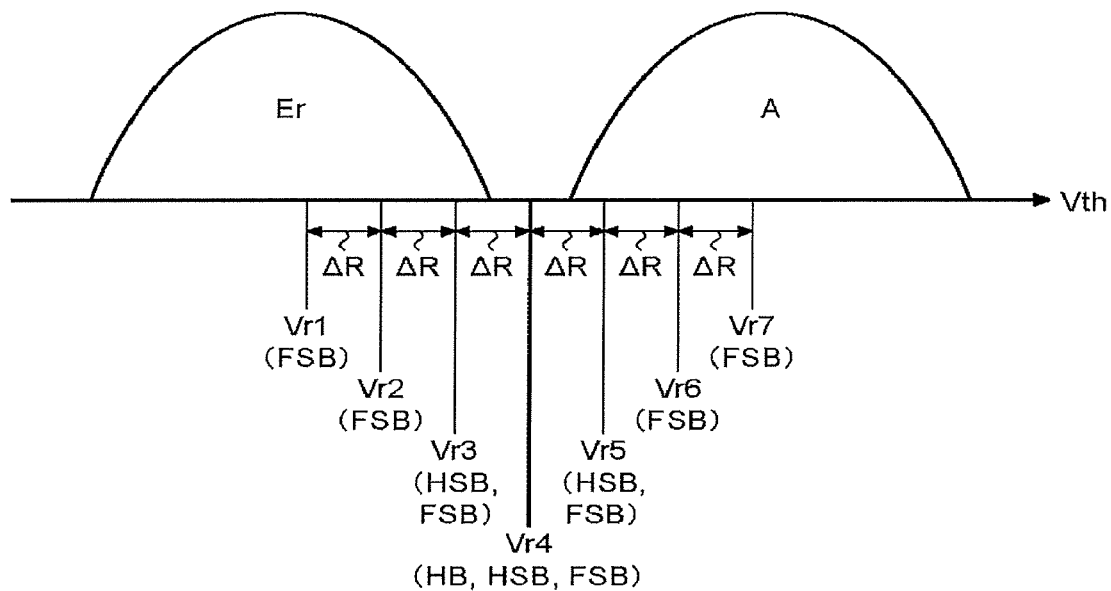
FIG. 3 is a schematic diagram illustrating examples of read voltages (read levels) used in a read operation for a memory cell in the embodiment.
Figure 4:
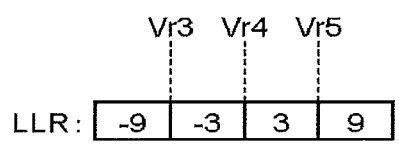
FIG. 4 is a diagram illustrating an example of an LLR table used in first soft-decision decoding according to the embodiment.
Figure 5:
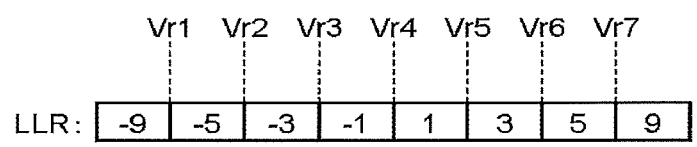
FIG. 5 is a diagram illustrating an example of an LLR table used in second soft-decision decoding according to the embodiment.

The flow from the reading of information by the HB read, the HSB read, and the FSB read to the generation of soft-decision values using soft-bit information according to the embodiment is described here in detail using FIGS. 3 to 5. FIG. 3 is a schematic diagram illustrating examples of read voltages (hereinafter also referred to as read levels) used in a read operation for a memory cell in the embodiment. FIG. 4 is a diagram illustrating an example of an LLR table used in first soft-decision decoding according to the embodiment. FIG. 5 is a diagram illustrating an example of an LLR table used in second soft-decision decoding according to the embodiment. In FIG. 3, the horizontal axis indicates a threshold voltage of data written in a memory cell, and the vertical axis represents the frequency of occurrence. Moreover, FIG. 3 illustrates, by example, a single level cell (SLC) where one memory cell stores one bit. An Er (Erase) distribution on the left indicates the distribution of the frequency of occurrence of a threshold voltage (also referred to as a threshold distribution) corresponding to a data value '1'. An A distribution on the right indicates a threshold distribution corresponding to a data value '0'. Furthermore, in the description, let a read level used in the HB read be a HB read level or reference read level, let a plurality of read levels used in the HSB read be HSB read levels, and let a plurality of read levels used in the FSB read be FSB read levels.

In a NAND memory, electrons are generally injected at the time of writing of data in such a manner that the number of electrons (the amount of charge) of a floating gate in a memory cell corresponds to any one of a plurality of threshold distributions, according to the data value. In a read operation for a memory cell, an electric current flows if a read voltage equal to or greater than a voltage value according to the amount of charge of the memory cell is applied, and an electric current does not flow if a read voltage less than the voltage value is applied. A voltage on the threshold between the flow and the non-flow of an electric current is determined, on a memory cell basis, according to the amount of charge of each memory cell. The boundary voltage determined according to the amount of charge of a memory cell is referred to as a "threshold voltage" in the description. Hence, in a write operation for a memory cell, electrons are injected into each memory cell in such a manner as to include the threshold voltage of the memory cell within the range of one of the two threshold distributions, as described above. On the other hand, in a read operation from a memory cell, a voltage (read level) around the voltage level on the boundary between the two threshold distributions is applied to the memory cell, and a value (hard-bit information or soft-bit information) held in the memory cell is decided on the basis of whether or not an electric current has flowed as a result of the application of the voltage.

The HB read according to the embodiment is a read operation of applying one read level (the HB read level) to a memory cell, deciding whether data stored in the memory cell is '1' or '0', and outputting a decision result. Therefore, each symbol (corresponding to a bit) in a received word read in the HB read from the NAND memory 20 has hard-bit information of one bit that takes the value of '0' or '1'.

In order to reduce the bit error rate (BER) of data that has been read, the HB read level for SLC is generally set at a voltage level that is substantially middle between a threshold voltage corresponding to the peak of the Er distribution and a threshold voltage corresponding to the peak of the A distribution (let the voltage level be the reference read level Vr4), as illustrated in FIG. 3. A read level that is shifted in voltage value from the reference read level Vr4 may be used in the HB read. In the embodiment, the shifted read level is not excluded. Moreover, a read using the shifted HB read level may also be referred to as the shift read.

On the other hand, a soft-decision read (hereinafter also referred to as the SB read) such as the HSB read and the FSB read according to the embodiment is a read operation of reading a value held by each memory cell as soft-bit information of a plurality of pages. A soft-decision value (LLR) of each symbol (corresponding to a bit) in a received word is generated from the soft-bit information that has been read.

The log-likelihood ratio (Log Likelihood Ratio: LLR) here is information where the probability that the value of each symbol (bit) is '0' and the probability that the value is '1' are expressed in logarithmic ratio. More specifically, the LLR is defined as one obtained by taking a logarithm of a ratio between a conditional probability P that a write bit x into a memory cell is logic '0' given that the value of the threshold voltage of the NAND memory 20 is included in a range a (x=0|a) and a conditional probability P that the write bit x into the memory cell is logic '1' given that the value of the threshold voltage is included in the range a (x=1|a). When this is expressed in an equation, the LLR is expressed as $\ln(P(x=0|a)/P(x=1|a))$. ln is a natural logarithm.

The LLR takes a greater value as the probability that the value of a bit is '0' is increased, and takes a smaller value as the probability that the value is '1' is increased. If the probability that the value of a bit is '0' and the probability that the value is '1' are equal, the LLR is zero.

In the embodiment, the value of each symbol of soft-bit information of a plurality of pages read in the SB read is converted into a received word of soft-decision values expressed in the LLR form. Therefore, the received word acquired by the SB read includes a string of a plurality of LLRs (also referred to as communication path values) corresponding respectively to a plurality of symbols configuring a write/read-target codeword. A symbol configuring a codeword (received word) basically corresponds, one-to-one, to a memory cell of the NAND memory 20.

Hence, in the embodiment, the HSB read levels used to read soft-bit information equal to the first number of pages include one or more read levels set on each side of the reference read level Vr4 in addition to the reference read level Vr4 used in the HB read. In, for example, an example illustrated in FIG. 3, a total of three read levels Vr3 to Vr5 including the reference read level Vr4 and the read levels Vr3 and Vr5, one read level set a predetermined space ΔR apart on each side of the reference read level Vr4, are used as the HSB read levels. In this case, each symbol configuring a received word read in the HSB read has soft-bit information of two bits that have been read using each of two HSB read levels Vr3 and Vr5, in addition to one-bit information (a hard bit) that has been read using the reference read level Vr4 (the HB read level).

Moreover, in addition to the reference read level Vr4 used in the HB read, the number of (for example, three) read levels greater than that of the HSB read levels is set, on each side of the reference read level Vr4, as the FSB read levels used to read soft-bit information equal to the second number of pages greater than the first number of pages. In, for example, the example illustrated in FIG. 3, a total of seven read levels Vr1 to Vr7 including the reference read level Vr4 and the read levels Vr1 to Vr3 and Vr5 to Vr7, three read levels set the predetermined space ΔR apart on each side of the reference read level Vr4, are used as the FSB read levels. In this case, each symbol configuring a received word read in the FSB read has soft-bit information of six bits that has been read using six FSB read levels Vr1 to Vr3 and Vr5 to Vr7, in addition to one-bit information (a hard bit) that has been read using the HB read level.

The numbers of the HSB read levels and the FSB read levels are not limited to three and seven illustrated by example in FIG. 3, respectively. Various modifications can be made to the numbers. In this case, each symbol configuring a received word read in the SB read has soft-bit information of bits that are equal in number to the number of read levels provided other than the HB read level. For example, if the number of bits of soft-bit information read by the HSB read is two to five bits, and the number of bits of soft-bit information read by the FSB read is six or more bits, an excellent balance between the processing speed and the correction capability in a tradeoff relationship can be obtained. Moreover, the space ΔR between read levels is not limited to one fixed value, either. Various modifications, such as changing the space ΔR depending on the order from the reference read level Vr4, can be made.

The LLR of each symbol in a received word that has been read using the above read levels can be obtained on the basis of a decision result of whether or not a threshold voltage of a relevant memory cell is equal to or greater than each read level (the values of hard-bit information and soft-bit information), using the LLR table illustrated in FIG. 4 or 5.

As illustrated in, for example, FIG. 4, if it is decided as a result of the HSB read that the threshold voltage of a memory cell is less than Vr3, the LLR of a symbol corresponding to the memory cell is identified as '−9'. Moreover, if it is decided that the threshold voltage of a memory cell is equal to or greater than Vr3 and less than Vr4, the LLR of a symbol corresponding to the memory cell is identified as '−3'. Similarly, if it is decided that the threshold voltage of a memory cell is equal to or greater than Vr4 and less than Vr5, the LLR of a symbol corresponding to the memory cell is identified as '3', and if it is decided that the threshold voltage of a memory cell is equal to or greater than Vr5, the LLR of a symbol corresponding to the memory cell is identified as '9'. Also in a case of the FSB read, the LLR of a symbol corresponding to a memory cell is similarly identified from the LLR table illustrated in FIG. 5, on the basis of the threshold voltage of the memory cell decided as a result of the FSB read.

FIGS. 4 and 5 are mere examples, and do not restrict the configuration of the LLR table. Moreover, it is also possible to obtain the LLR of a symbol using a predetermined calculation equation instead of the LLR table.

The operation of obtaining an LLR on the basis of a decision result of whether or not the threshold voltage of each memory cell is equal to or greater than each read level (the values of hard-bit information and soft-bit information) is executed by, for example, the codeword processor 145 in the ECC unit 14 illustrated in FIG. 2. Hence, in a case of, for example, the HSB read, the codeword processor 145 identifies one of four ranges of the threshold voltage of a memory cell, less than Vr3, equal to or greater than Vr3 and less than Vr4, equal to or greater than Vr4 and less than Vr5, and equal to or greater than Vr5, on the basis of the decision result (the values of hard-bit information and soft-bit information), acquires an LLR corresponding to the identified range from, for example, the LLR table illustrated by example in FIG. 4, and outputs the acquired LLR to the selector 144. On the other hand, in a case of the FSB read, the codeword processor 145 identifies one of eight ranges of the threshold voltage of a memory cell, less than Vr1, equal to or greater than Vr1 and less than Vr2, equal to or greater than Vr2 and less than Vr3, equal to or greater than Vr3 and less than Vr4, equal to or greater than Vr4 and less than Vr5, equal to or greater than Vr5 and less than Vr6, equal to or greater than Vr6 and less than Vr7, and equal to or greater than Vr7, on the basis of a decision result (the values of hard-bit information and soft-bit information), acquires an LLR corresponding to the identified range from, for example, the LLR table illustrated by example in FIG. 5, and outputs the acquired LLR to the selector 144.

However, the operation of obtaining an LLR on the basis of a decision result of whether or not the threshold voltage of each memory cell is equal to or greater than each read level (the values of hard-bit information and soft-bit information) may be executed by, not limited to only the ECC unit 14 in the NAND controller 13, but also on the NAND memory 20 side. If the operation is executed on the NAND memory 20 side, the NAND memory 20 is simply required to acquire the LLR of each symbol by an operation similar to the above-mentioned codeword processor 145 from information on which range a threshold voltage belongs to on a memory cell basis (the values of hard-bit information and soft-bit information).

In FIGS. 3 to 5, the case of SLC to store one bit/cell is described as an example. However, also in a case of a multiple level cell (MLC), reading is performed using a plurality of read levels according to the boundary of the threshold distribution as in the case of SLC. An LLR is identified on the basis of a result of reading using the plurality of read levels.

Next, a write operation into the NAND memory 20 according to the embodiment is described with reference back to FIGS. 1 and 2. When accepting a write request from the host 2 via the host I/F 15, the CPU 11 temporarily stores user data included in the write request in the SRAM 16, and also translates a logical address specified by the write request into a physical address with the unillustrated address translation table, and instructs the NAND controller 13 corresponding to the physical address to encode the user data stored in the SRAM 16 and write, into the NAND memory 20, a codeword obtained by the encoding.

The access controller 131 of the NAND controller 13 acquires target user data from the SRAM 16 on the basis of the instruction of the CPU 11, and inputs the acquired user data into the encoder 141. The encoder 141 executes LDPC coding on the inputted user data, generates a codeword, and inputs the generated codeword into the memory I/F 132. The memory I/F 132, into which the codeword has been inputted, executes a write operation of storing the codeword in a storage location in the NAND memory 20 instructed from the CPU 11 or the access controller 131.

Next, a read operation from the NAND memory 20 according to the embodiment is described. FIG. 6 is a flowchart illustrating an example of a read operation according to the embodiment. As illustrated in FIG. 6, when the CPU 11 accepts a read request from the host 2 via the host I/F 15, a physical address of a NAND memory is identified from a logical address specified in the read request. The NAND controller 13 corresponding to the identified physical address (the NAND memory 20) executes the HB read (S101). More specifically, the CPU 11 translates the logical address specified by the read request into a physical address using the unillustrated address translation table, and instructs the NAND controller 13 corresponding to the physical address to read a codeword in the HB read from the NAND memory 20. At this point in time, the CPU 11 instructs the NAND controller 13 to also perform hard-decision decoding on a codeword (received word) read from the NAND memory 20. The access controller 131 of the specified NAND controller 13 instructs the memory I/F 132 to execute the HB read at the address specified in the NAND memory 20. Consequently, the memory I/F 132 executes the HB read at the specified address in the NAND memory 20, and inputs, into the ECC unit 14, hard-bit information (corresponding to a codeword of hard-decision values) that has been read as a result of the HB read.

Next, in the ECC unit 14, into which the read hard-bit information has been inputted, hard-decision decoding is executed on the fly on the hard-bit information (the received word of the hard-decision values) (S102). More specifically, the access controller 131, into which the instruction of the CPU 11 was inputted in S101, inputs an instruction that the generation of an LLR is not required into the codeword processor 145, and also inputs, into the selector 144 of the ECC unit 14, a select signal to input the inputted received word into the hard-decision decoder 142. Therefore, the hard-bit information (the received word of the hard-decision values) read by the memory I/F 132 from the NAND memory 20 is inputted into the selector 144 through the codeword processor 145, and then inputted into the hard-decision decoder 142 via the selector 144. The hard-decision decoder 142 executes hard-decision decoding on the fly on the inputted received word. When a termination condition (also referred to as the truncation condition) of hard-decision decoding is achieved and then hard-decision decoding is terminated, a decoded word obtained by hard-decision decoding is stored in the SRAM 16 via the access controller 131 (S103), and also notice of the termination of hard-decision decoding is given to the CPU 11. The termination condition (truncation condition) can be set to, for example, that a sufficiently likely decoded word has been obtained and that the number of repeats of hard-decision decoding has reached a predetermined number determined in advance.

Next, in the CPU 11, it is determined from the decoded word stored in the SRAM 16 whether hard-decision decoding has succeeded or failed (S104). If hard-decision decoding has succeeded (S104; YES), the operation skips to S113. On the other hand, if hard-decision decoding has failed (S104; NO), the HSB read is then executed (S105). Specifically, the CPU 11, which has judged that hard-decision decoding has failed, instructs the NAND controller 13 corresponding to a physical address (the NAND memory 20) identified from a logical address specified in a read request to read a codeword in the HSB read from the NAND memory 20. At this point in time, the CPU 11 instructs the NAND controller 13 to also perform first soft-decision decoding on the codeword (received word) read from the NAND memory 20. The access controller 131 of the instructed NAND controller 13 instructs the memory I/F 132 to execute the HSB read at the specified address in the NAND memory 20. Consequently, the memory I/F 132 executes the HSB read at the specified address in the NAND memory 20, and inputs, into the ECC unit 14, soft-bit information that has been read as a result of the HSB read. The CPU 11 may notify the NAND controller 13 again of specification of a physical address to serve as a read destination of the HSB read, or a physical address held on the NAND controller 13 side may be used upon the HB read.

Next, in the ECC unit 14 into which the read soft-bit information has been inputted, the generation of HSB soft-decision values and first soft-decision decoding for a received word of the HSB soft-decision values generated are executed on the fly (S106). More specifically, when instructing the memory I/F 132 to execute the HSB read in S105, the access controller 131 inputs an instruction to generate LLRs using, for example, the LLR table illustrated by example in FIG. 4, into the codeword processor 145, and also inputs, into the selector 144 of the ECC unit 14, a select signal to input the inputted received word into the first soft-decision decoder 143. Therefore, the codeword processor 145, into which the soft-bit information read by the memory I/F 132 from the NAND memory 20 has been inputted, generates LLRs from the inputted soft-bit information, using, for example, the LLR table illustrated by example in FIG. 4 to generate a received word of HSB soft-decision values. The generated received word of the HSB soft-decision values is inputted into the first soft-decision decoder 143 via the selector 144. The first soft-decision decoder 143 executes first soft-decision decoding on the fly on the inputted received word. When the termination condition (truncation condition) of first soft-decision decoding is achieved and then first soft-decision decoding is terminated, a decoded word obtained by first soft-decision decoding is stored in the SRAM 16 via the access controller 131 (S107), and also notice of the termination of first soft-decision decoding is given to the CPU 11. The termination condition (truncation condition) of first soft-decision decoding in S106 can also be set to, for example, that a sufficiently likely decoded word has been obtained and that the number of repeats of first soft-decision decoding has reached a predetermined number determined in advance, as in the termination condition (truncation condition) of hard-decision decoding in S102.

Next, in the CPU 11, it is determined from the decoded word stored in the SRAM 16 whether or not first soft-decision decoding has succeeded (S108). If first soft-decision decoding has succeeded (S108; YES), the operation skips to S113. On the other hand, if first soft-decision decoding has failed (S108; NO), the FSB read is then executed (S109). Specifically, the CPU 11, which has judged that first soft-decision decoding failed, instructs the NAND controller 13 corresponding to the physical address (the NAND memory 20) identified from the logical address specified in the read request to read a codeword in the FSB read from the NAND memory 20. The access controller 131 of the specified NAND controller 13 instructs the memory I/F 132 to execute the FSB read at the specified address in the NAND memory 20. Consequently, the memory I/F 132 executes the FSB read at the specified address in the NAND memory 20, and inputs soft-bit information read as a result of the FSB read into the ECC unit 14. The CPU 11 may notify the NAND controller 13 again of the specification of a physical address to serve as a read destination of the FSB read, or a physical address held on the NAND controller 13 side may be used upon the HB read or HSB read.

In S109, the access controller 131 inputs, into the codeword processor 145, an instruction to generate LLRs using, for example, the LLR table illustrated by example in FIG. 5, and also inputs, into the selector 144 of the ECC unit 14, a select signal to input the inputted received word directly into the access controller 131. Therefore, the codeword processor 145, into which the soft-bit information read in S109 has been inputted, generates LLRs from the inputted soft-bit information, using, for example, the LLR table illustrated by example in FIG. 5 to generate a received word of FSB soft-decision values. The generated received word of the FSB soft-decision values is inputted into the access controller 131 via the selector 144. The access controller 131 sequentially accumulates the inputted received words in the SRAM 16 (S110).

Next, the CPU 11 instructs the second soft-decision decoder 17 to execute second soft-decision decoding on the received word of the FSB soft-decision values accumulated in the SRAM 16. Consequently, the second soft-decision decoder 17 executes second soft-decision decoding on the received word of the FSB soft-decision values accumulated in the SRAM 16 (S111).

When the termination condition (truncation condition) of second soft-decision decoding is achieved and then second soft-decision decoding is terminated, it is determined in the CPU 11 whether or not second soft-decision decoding has succeeded (S112). The termination condition (truncation condition) of second soft-decision decoding in Sill can also be set to, for example, that a sufficiently likely decoded word has been obtained and that the number of repeats of second soft-decision decoding has reached a predetermined number determined in advance, as in the above-mentioned termination condition (truncation condition). If second soft-decision decoding has succeeded (S112; YES), the operation proceeds to S113. On the other hand, if it is judged in the embodiment that second soft-decision decoding being the last decoding has failed (S112; NO), the CPU 11 returns a data read error to the host 2 that issued the read request (S114). The operation subsequently ends.

In S113, the reconstructed user data stored in the SRAM 16 is outputted to the host 2 that issued the read request via the host I/F 15 under the instruction of the CPU 11. The operation subsequently ends.

As described above, according to the embodiment, the amount of information of a codeword (received word) is increased in stages according to the success/failure of decoding where the error-correction capability differs in stages. Specifically, hard-decision decoding is executed first on a received word of hard-decision values. If hard-decision decoding has failed, a received word of HSB soft-decision values having a larger amount of information than the received word of the hard-decision values is read to execute first soft-decision decoding. If first soft-decision decoding has failed, a received word of FSB soft-decision values having a still larger amount of information than the received word of the HSB soft-decision values is read to execute second soft-decision decoding. As described above, among hard-decision decoding, first soft-decision decoding, and second soft-decision decoding, the error-correction capability of hard-decision decoding is the lowest, and the error-correction capability of second soft-decision decoding is the highest. Such a configuration is included to enable an increase in error-correction capability in stages according to the situation and the like even if, for example, read disturb (RD) or data retention (DR) causes a reduction in BER. As a result, a bit error can be efficiently and effectively corrected.

Moreover, in the embodiment, the LDPC coding method that can increase the error-correction capability without increasing the code length of a codeword generated is employed as the coding method. The LDPC coding method does not need to increase the code amount (code length) of a codeword to increase the error-correction capability as in, for example, BCH coding where the error-correction capability is fixed with the same code length. Hence, the LDPC coding method is employed as the coding method of the memory system 1 according to the above-mentioned embodiment. Accordingly, it becomes possible to construct a memory system with high reliability that reduces the BER without reducing the OP rate.

Furthermore, in the embodiment, the decoders (the hard-decision decoder 142, the first soft-decision decoder 143, and the second soft-decision decoder 17) are provided respectively for decoding where the error-correction capability differs in stages (hard-decision decoding, first soft-decision decoding, and second soft-decision decoding). Such a configuration enables the memory system 1 to achieve an optimized balance between the circuit scale, the operation speed, and the error-correction capability. In terms of, for example, hard-decision decoding and first soft-decision decoding where the processing amount is relatively small and a required circuit scale is relatively small, it is configured in such a manner that a decoder (the hard-decision decoder 142/the first soft-decision decoder 143) is provided on each channel to execute decoding on the fly. Accordingly, it becomes possible to reduce an influence on the circuit scale and execute a quick decoding process. Moreover, in terms of second soft-decision decoding where the processing amount is relatively large and a required circuit scale is relatively large, a decoder (the second soft-decision decoder 17) is shared among a plurality of channels. Accordingly, it becomes possible to achieve a high error-correction capability while reducing an increase in circuit scale.

In the embodiment, the case is illustrated by example in which the hard-decision decoder 142 and the first soft-decision decoder 143 are provided to each channel, and the second soft-decision decoder 17 is shared among all the channels. However, the embodiment is not limited to this configuration. It is also possible to have, for example, a configuration where one hard-decision decoder 142 and/or one first soft-decision decoder 143, which are shared among a plurality of channels equal to or less than the total of channels, are connected to the internal bus 18.

Moreover, in the embodiment, the case is illustrated by example in which the decoders (the hard-decision decoder 142, the first soft-decision decoder 143, and the second soft-decision decoder 17) are provided respectively to decoding (hard-decision decoding, first soft-decision decoding, and second soft-decision decoding) where the error-correction capability differs in stages. However, the embodiment is not limited to this configuration. For example, it is also possible to integrate the hard-decision decoder 142 and the first soft-decision decoder 143 into one decoder (for example, the first soft-decision decoder 143) shared between hard-decision decoding and first soft-decision decoding. Moreover, it is also possible to integrate the first soft-decision decoder 143 and the second soft-decision decoder 17 into one decoder (for example, the second soft-decision decoder 17) shared between first soft-decision decoding and second soft-decision decoding.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller that is connected to one or more nonvolatile memories, the memory controller comprising:

a memory interface that reads a codeword written in any one of the one or more nonvolatile memories as any one of hard-bit information, first soft-bit information, and second soft-bit information;

a codeword processor that generates a codeword of a first soft-decision value from the first soft-bit information, and generates a codeword of a second soft-decision value from the second soft-bit information;

a first decoder that executes hard-decision decoding on a codeword of a hard-decision value configured from the hard-bit information;

a second decoder that executes first soft-decision decoding on the codeword of the first soft-decision value; and a third decoder that executes second soft-decision decoding on the codeword of the second soft-decision value, wherein the first soft-bit information includes information having a first number of bits greater than the number of bits of the hard-bit information, the second soft-bit information includes information having a second number of bits greater than the first number of bits, the codeword processor further comprises a data buffer that accumulates the codeword of the second soft-decision value generated from the second soft-bit information, and the third decoder executes the second soft-decision decoding on the codeword of the second soft-decision value.

2. The memory controller according to claim 1, further comprising a control circuit that instructs the memory interface to read the hard-bit information from any one of the one or more nonvolatile memories, the first decoder to execute the hard-decision decoding on the codeword of the hard-decision value, the memory interface to read the first soft-bit information from the nonvolatile memory in response to a judgment that the hard-decision decoding has failed, the second decoder to execute the first soft-decision decoding on the codeword of the first soft-decision value, the memory interface to read the second soft-bit information from the nonvolatile memory in response to a judgement that first soft-decision decoding has failed, and the third decoder to execute the second soft-decision decoding on the codeword of the second soft-decision value.

3. The memory controller according to claim 1, wherein the first decoder executes the hard-decision decoding on the fly on the codeword of the hard-decision value read as the hard-bit information, and the second decoder executes the first soft-decision decoding on the fly on the codeword of the first soft-decision value generated from the first soft-bit information.

4. The memory controller according to claim 1, further comprising a plurality of channels, each of which is independently connectable to any one of the one or more nonvolatile memories, wherein at least one of the first decoder and the second decoder is provided to each of the plurality of channels.

5. The memory controller according to claim 1, wherein the first number of bits of the first soft-decision value is two to five, and the second number of bits of the second soft-decision value is six or greater.

6. The memory controller according to claim 1, further comprising an encoder that encodes data targeted to be written into the nonvolatile memory with a coding method using a LDPC (Low-Density Parity-Check) code, wherein the memory interface outputs a codeword encoded by the encoder to the nonvolatile memory.

7. The memory controller according to claim 1, wherein the memory controller is a semiconductor device including a SoC (System on Chip).

8. A memory system comprising:

one or more nonvolatile memories; and a memory controller connected to the one or more nonvolatile memories, wherein the memory controller comprises a memory interface that reads a codeword written in any one of the one or more nonvolatile memories as any one of hard-bit information, first soft-bit information, and second soft-bit information;

a codeword processor that generates a codeword of a first soft-decision value from the first soft-bit information, and generates a codeword of a second soft-decision value from the second soft-bit information;

a first decoder that executes hard-decision decoding on a codeword of a hard-decision value configured from the hard-bit information;

a second decoder that executes first soft-decision decoding on the codeword of the first soft-decision value; and a third decoder that executes second soft-decision decoding on the codeword of the second soft-decision value, and wherein the first soft-bit information includes information having a first number of bits greater than the number of bits of the hard-bit information, the second soft-bit information includes information having a second number of bits greater than the first number of bits, the codeword processor further comprises a data buffer that accumulates the codeword of the second soft-decision value generated from the second soft-bit information, and the third decoder executes the second soft-decision decoding on the codeword of the second soft-decision value accumulated in the data buffer.

9. The memory system according to claim 8, wherein the memory controller further comprises a control circuit that instructs the memory interface to read the hard-bit information from any one of the one or more nonvolatile memories, the first decoder to execute the hard-decision decoding on the codeword of the hard-decision value, the memory interface to read the first soft-bit information from the nonvolatile memory in response to a judgment that the hard-decision decoding has failed, the second decoder to execute the first soft-decision decoding on the codeword of the first soft-decision value, the memory interface to read the second soft-bit information from the nonvolatile memory in response to a judgement that first soft-decision decoding has failed, and the third decoder to execute the second soft-decision decoding on the codeword of the second soft-decision value.

10. The memory system according to claim 8, wherein the first decoder executes the hard-decision decoding on the fly on the codeword of the hard-decision value read as the hard-bit information, and the second decoder executes the first soft-decision decoding on the fly on the codeword of the first soft-decision value generated from the first soft-bit information.

11. The memory system according to claim 8, wherein the memory controller further comprises one or more channels, each of which is independently connected to any one of the one or more nonvolatile memories, and at least one of the first decoder and the second decoder is provided to each of the one or more channels.

12. The memory system according to claim 8, wherein the data buffer is SRAM (Static Random Access Memory) or DRAM (Dynamic Random Access Memory).

13. The memory system according to claim 8, wherein the first number of bits of the first soft-decision value is two to five, and the second number of bits of the second soft-decision value is six or greater.

14. The memory system according to claim 8, further comprising an encoder that encodes data targeted to be written into the nonvolatile memory with a coding method using a LDPC (Low-Density Parity-Check) code, wherein the memory interface outputs a codeword encoded by the encoder to the nonvolatile memory.

15. The memory system according to claim 8, wherein the memory controller is a semiconductor device including a SoC (System on Chip).

16. The memory system according to claim 8, wherein the nonvolatile memory is NAND flash memory.

17. A method for controlling a memory system including one or more nonvolatile memories, and a memory controller connected to the one or more nonvolatile memories, the method comprising:
  reading a codeword written in any one of the one or more nonvolatile memories as any one of hard-bit information, first soft-bit information, and second soft-bit information;
  generating a codeword of a first soft-decision value from the first soft-bit information;
  generating a codeword of a second soft-decision value from the second soft-bit information;
  executing hard-decision decoding on a codeword of a hard-decision value configured from the hard-bit information;
  executing first soft-decision decoding on the codeword of the first soft-decision value;
  accumulating, in a data buffer, the codeword of the second soft-decision value generated from the second soft-bit information; and
  executing second soft-decision decoding on the codeword of the second soft-decision value accumulated in the data buffer, wherein
  the first soft-bit information includes information having a first number of bits greater than the number of bits of the hard-bit information, and
  the second soft-bit information includes information having a second number of bits greater than the first number of bits.

18. The method according to claim 17, further comprising:
  reading the hard-bit information from any one of the one or more nonvolatile memories,
  executing the hard-decision decoding on the codeword of the hard-decision value,
  reading the first soft-bit information from the nonvolatile memory in response to a judgment that the hard-decision decoding has failed,
  executing the first soft-decision decoding on the codeword of the first soft-decision value,
  reading the second soft-bit information from the nonvolatile memory in response to a judgement that the first soft-decision decoding has failed, and
  executing the second soft-decision decoding on the codeword of the second soft-decision value.

19. The method according to claim 17, further comprising:
  executing the hard-decision decoding on the fly on the codeword of the hard-decision value read as the hard-bit information, and
  executing the first soft-decision decoding on the fly on the codeword of the first soft-decision value generated from the first soft-bit information.

* * * * *